(12) United States Patent
Lo

(10) Patent No.: US 7,850,217 B2
(45) Date of Patent: Dec. 14, 2010

(54) EQUIDISTANCE PICK-AND-PLACE DEVICE FOR ICS

(75) Inventor: Ming-Chih Lo, Taipei Hsien (TW)

(73) Assignee: System General Corp., Taipei Hsien (TW)

( * ) Notice: Subject to any disclaimer, the term of this patent is extended or adjusted under 35 U.S.C. 154(b) by 468 days.

(21) Appl. No.: 12/051,057

(22) Filed: Mar. 19, 2008

(65) Prior Publication Data

US 2009/0238671 A1  Sep. 24, 2009

(51) Int. Cl.
*B65G 47/26* (2006.01)
(52) U.S. Cl. .................. 294/65; 414/752.1; 198/460.2
(58) Field of Classification Search .............. 414/749.1, 414/752.1; 294/65; 198/468.4, 588, 594, 198/812, 460.2
See application file for complete search history.

(56) References Cited

U.S. PATENT DOCUMENTS 6,439,631 B1 * 8/2002 Kress ........................ 294/65

2002/0153735 A1 * 10/2002 Kress ........................ 294/87.1

OTHER PUBLICATIONS

Exhibited publicly, Productronica Nov. 13-16, 2007.

* cited by examiner

*Primary Examiner*—Donald Underwood
(74) *Attorney, Agent, or Firm*—Ming Chow; Sinorica, LLC

(57) ABSTRACT

An equidistance pick-and-place device for ICs is disclosed. It comprises a housing, a driving device, a guideway structure, a moving structure, a lazy tongs, a plurality of pick-and-place structures, and a transmission structure. The housing supports the equidistance pick-and-place device. The guideway structure is set on the housing. The moving structure slides on the guideway structure. The pick-and-place structures are set on the moving structure. The free end and the shafts of the lazy tongs are fixed in the moving structure. The transmission structure is connected with the driving device and the moving structure for driving the moving structure. The equidistance pick-and-place device utilizes the lazy tongs to drive the pick-and-place structures moving with equidistance to pick and place a plurality of ICs at a time. Therefore, the present invention can improve the efficiency and reduce cost.

20 Claims, 4 Drawing Sheets

EQUIDISTANCE PICK-AND-PLACE DEVICE FOR ICS

BACKGROUND OF THE INVENTION

1. Field of the Invention

The present invention relates to a pick-and-place device for ICs, and more particularly, to an equidistance pick-and-place device for ICs.

2. Description of Related Art

Nowadays the pick-and-place device for ICs is improved from single nozzle to multiple nozzles. The pick-and-place device is utilized to pick and place the ICs from a plate to next station for IC detection or IC burning, etc. The approach was disclosed as "classification device for IC test", Taiwan patent No. M299296. The test area of the machine includes a plurality of test sockets, a plurality of test units, and a pick-and-place structure. The test sockets correspond to the test units respectively. The pick-and-place structure can pick or place a chip on the test socket. The test socket holds the chip and the test unit tests the chip. The pick-and-place structure consists of a plurality of nuzzle units, a elevating structure and a translation structure. The nuzzle units are set on a holder. The elevating structure carries the holder to move up or down. The translation structure carries the elevating structure to move sidelong on the machine. The nuzzle unit further includes the lines and control circuit for picking and placing the chip at a predetermined time.

Although, the pick-and-place structure has the nozzle units and the nozzle units can move up, down and sidelong, but the distances between the nozzle units can not change so the classification device needs another pick-and-place structure to pick the ICs from a plate to a carry area, and then the above pick-and-place structure picks the ICs from the carry area and places the ICs on the test sockets. Therefore, the cost of the classification device is expensive due to need another pick-and-place structure, and the efficiency of the classification device is low. According to above drawbacks, the present invention provides an equidistance pick-and-place device for ICs for improving the efficiency and reducing cost.

SUMMARY OF THE INVENTION

The present invention provides an equidistance pick-and-place device for ICs. The equidistance pick-and-place device comprises a housing, a driving device, a guideway structure, a moving structure, a lazy tongs, a plurality of pick-and-place structures, and a transmission structure. The housing is utilized to support the equidistance pick-and-place device. The driving device and the guideway structure are set on the housing. The moving structure is set on the guideway structure. The lazy tongs has a fixed end, a free end and a plurality of shafts. The free end and the shafts are fixed in the moving structure. The distance between the fixed end and the shaft being adjacent to the fixed end, the distances between the shafts, and the distance between the free end and the shaft being adjacent to the free end are equal when the lazy tongs operates. The pick-and-place structures are set on the moving structure for picking and placing the ICs with the equidistance. The transmission structure is connected with the driving device and the moving structure. The transmission structure forces the moving structure to move when the driving device drives the transmission structure. The moving structure slides on the guideway structure and drives the lazy tongs and the pick-and-place structures to move.

The lazy tongs drives the pick-and-place structures to pick and place the ICs with the equidistance. The pick-and-place structures can pick and place a plurality of ICs at a time. Therefore, the present invention can improve the efficiency and reduce cost.

DESCRIPTION OF THE PREFERRED EMBODIMENTS

Figure 1:
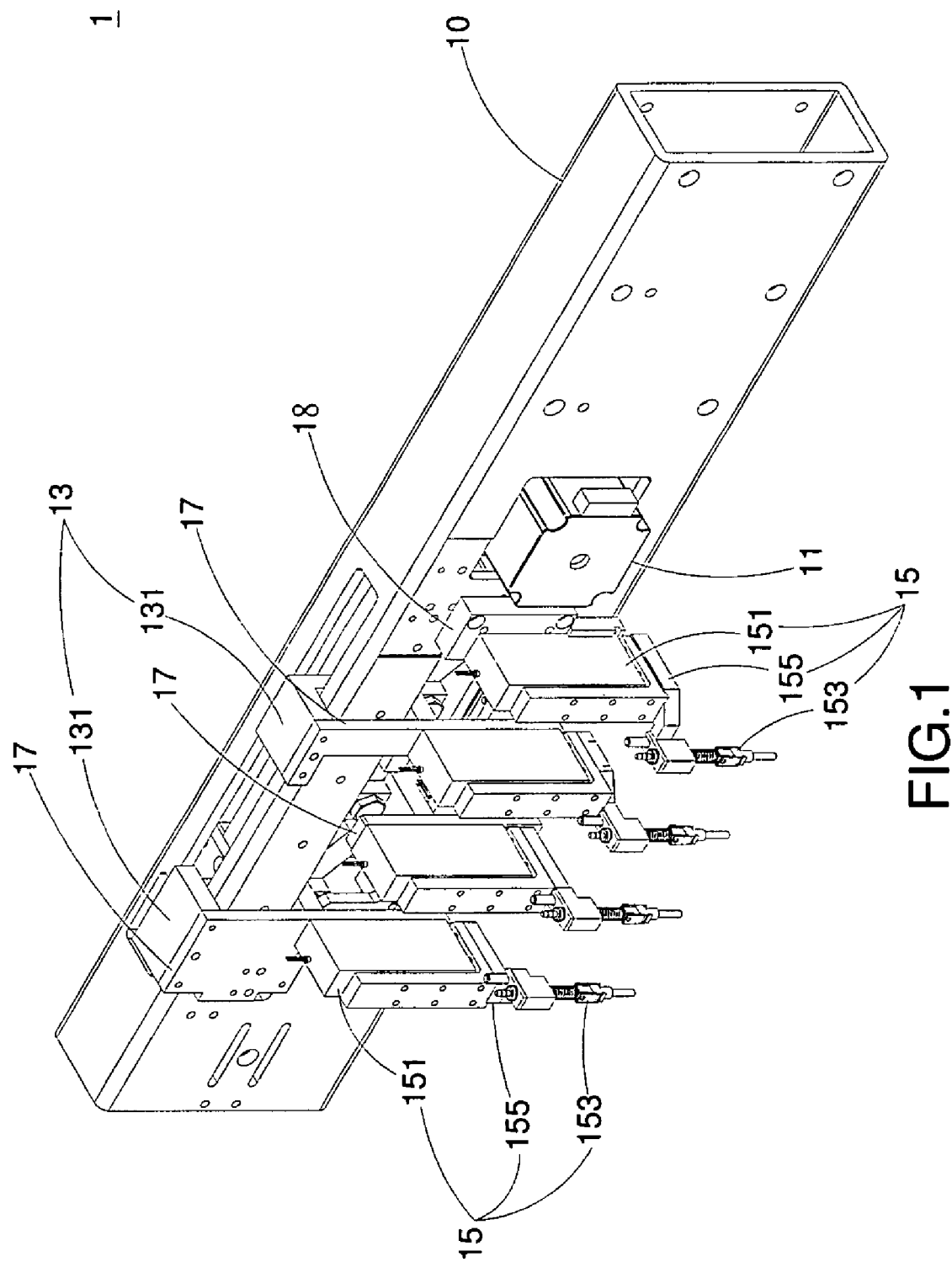
FIG. 1 shows a structure diagram of an equidistance pick-and-place device according to one embodiment of the present invention.
Figure 2:
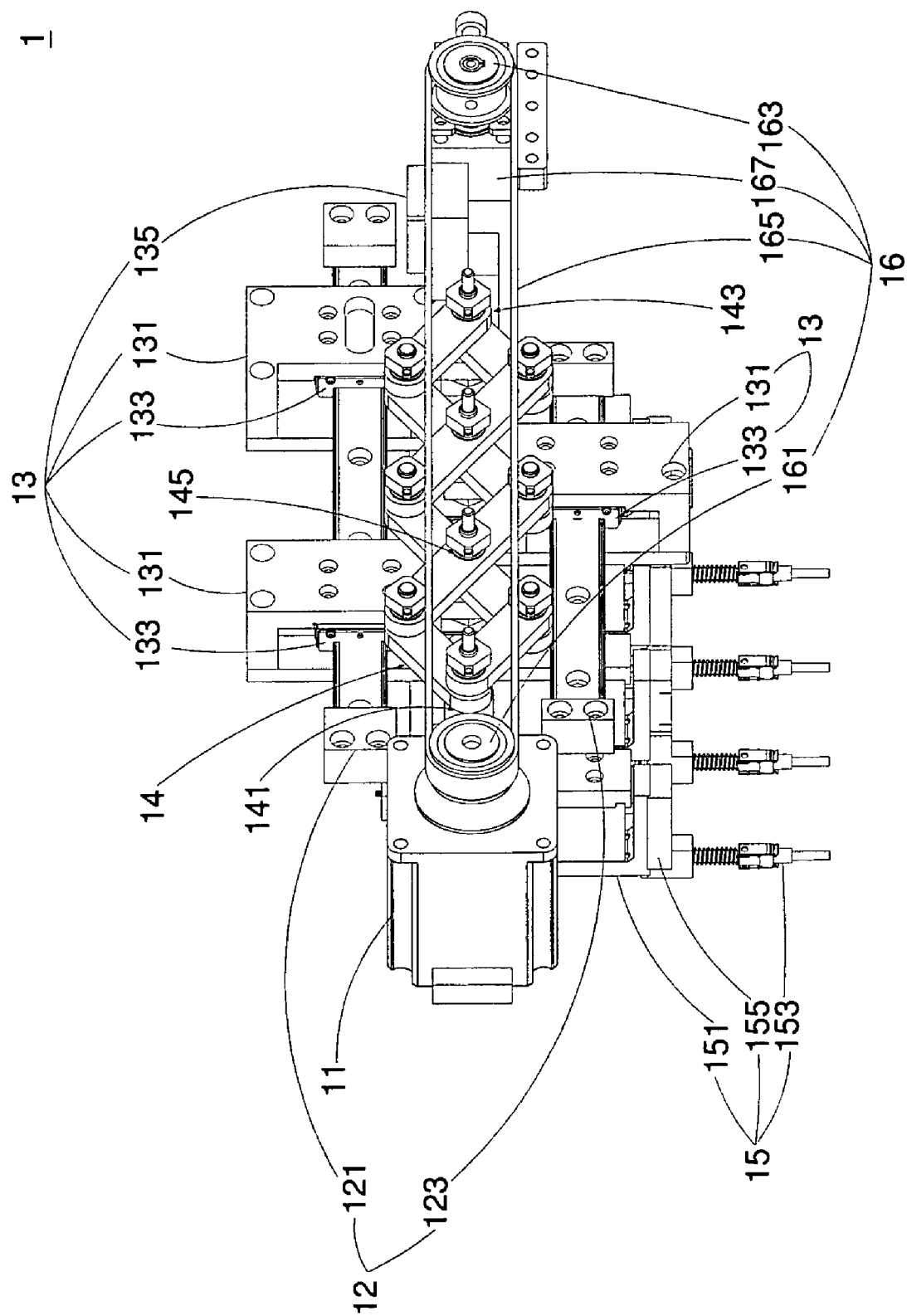
FIG. 2 shows another structure diagram of the equidistance pick-and-place device according to one embodiment of the present invention.

Referring to FIG. 1 and FIG. 2, an equidistance pick-and-place device 1 for ICs is illustrated according the one preference embodiment of the present invention. The equidistance pick-and-place device 1 comprises a housing 10, a driving device 11, a guideway structure 12, a moving structure 13, a lazy tongs 14, a plurality of pick-and-place structures 15, and a transmission structure 16. The housing 10 is utilized to support the equidistance pick-and-place device 1. The driving device 11 and the guideway structure 12 are set on the housing 10. The moving structure 13 is set on the guideway structure 12 and slides on the guideway structure 12. The lazy tongs 14 has a fixed end 141, a free end 143, and a plurality of shafts 145, and the lazy tongs 14 is parallel with the guideway structure 12. In this embodiment, the fixed end 141 is set on the housing 10 and can not move. Another, the free end 143 is not set on the housing 10 and can free move. The lazy tongs 14 is a parallel motion mechanism. Therefore, the fixed end 141, the free end 143 and the shafts 145 of the lazy tongs 14 are in a line. Another, the free end 143 and the shafts 145 move with equidistance. The distance between the fixed end 141 and the neighbor shaft 145 being adjacent to the fixed end 141, the distances between the shafts 145, and the distance between the free end 143 and the neighbor shaft 145 being adjacent to the free end 143 are equal when lazy tongs 14 operates. The moving structure 13 is fixed in the free end 143 and the shafts 145 of the lazy tongs 14. The pick-and-place structures 15 are set on the moving structure 13 for picking and placing the ICs. Furthermore, another pick-and-place structure 15 can be set on the fixed end 141 and located side of the driving device 11 (shown in the FIG. 1).

The driving device 11 is set on the housing 10 and adjacent to the fixed end 141 of the lazy tongs 14 according the one embodiment of the present invention. The driving device 11 is connected with the transmission structure 16 to drive the transmission structure 16. The transmission structure 16 is connected with the moving structure 13 to drive the moving structure 13 sliding on the guideway structure 12. Therefore, the moving structure 13 drives the free end 141 of the lazy tongs 14 to move for driving the lazy tongs 14 operating, and the shafts 145 of the lazy tongs 14 are drove to move. The free end 143 and the shafts 145 move with equidistance. Thus, the moving structure 13 fixed in the shafts 145 and the free end 143 are drove to move with equidistance, and the pick-and-place structures 15 set on the moving structure 13 will move with equidistance to pick and place the ICs with equidistance. The driving device 11 can be a motor according the one embodiment of the present invention.

As shown in FIG. 2, the guideway structure 12 includes a first guideway 121 and a second guideway 123. The first guideway 121 and the second guideway 123 are set on two sides of the housing 10 respectively. The first guideway 121 parallels with the second guideway 123. The first guideway 121 and the second guideway 123 are linear guideways according the one embodiment of the present invention. The moving structure 13 includes a plurality of moving components 131. The moving components 131 are fixed in the free end 143 and the shafts 145 of the lazy tongs 14 respectively. The pick-and-place structures 15 are set on the moving components 131 respectively. Because of the free end 143 and the shafts 145 move with equidistance when the lazy tongs 14 operates, each of the moving components 131 of the moving structure 13 is forced to move with equidistance, and each of the pick-and-place structures 15 is forced to move with equidistance. The moving structure 13 further includes a plurality of sliding components 133. The sliding components 133 are set on the first guideway 121 and the second guideway 123 respectively for sliding on the guideway structure 12 smoothly and linearly. The moving components 131 are set on the sliding components 133 respectively. According to another embodiment of the present invention, the sliding components 133 all are set on the first guideway 121 or the second guideway 123. It means that the guideway structure 12 can include only one guideway.

The moving structure 13 further comprises a transmission component 135. The transmission component 135 is set on the moving component 131 fixed in the free end 143 of the lazy tongs 14. The transmission component 135 is connected with the transmission structure 16. The transmission structure 16 drives the transmission component 135 to move, and then the transmission component 135 forces the moving component 131 fixed in the free end 143 to move. Thus the lazy tongs 14 is drove to operate, that the free end 143 and the shafts 145 of the lazy tongs 14 move with equidistance. Therefore, the moving components 131 fixed in the free end 143 and the shafts 145 move with equidistance and drive the pick-and-place structures 15 to move with equidistance. The lazy tongs 14 is a parallel motion mechanism, and therefore the fixed end 141, the free end 143 and the shafts 145 of the lazy tongs 14 are in a line. The first guideway 121 and the second guideway 123 of the guideway structure 12 are parallel with the fixed end 141, the free end 143 and the shafts 145 of the lazy tongs 14. Thus the moving component 131 fixed in the free end 143 and the shafts 145 can slide on the first guideway 121 or the second guideway 123 straight, and the pick-and-place structures 15 set on the moving component 131 can linear move to pick and place the ICs.

As shown in FIG. 1 and FIG. 2, each of the pick-and-place structures 15 includes an actuator 151 and a nuzzle 153. The actuator 151 is set on the moving component 131. The nuzzle 153 is connected to the actuator 151. Each of the pick-and-place structures 15 further includes a carrier 155. The carrier 155 is connected with the actuator 151 to carry the nozzle 153 for picking and placing the ICs. The actuator 151 is an air cylinder according to one embodiment of the present invention. Additionally, each of the actuators 151 further is set on the moving structure 13 through a holding component 17 according the one embodiment of the present invention. The holding components 17 are set on the moving components 131 of the moving structure 13 in order to let the pick-and-place structures 15 being in a line. The shapes of the holding components 17 can be variation. Furthermore, the pick-and-place structure 15 set on the fixed end 141 of the lazy tongs 14 is further set on a holding component 18. The holding component 18 is set on the housing 10 and connected with the fixed end 141 of the lazy tongs 14 to set the pick-and-place structure 15 on the fixed end 141. Therefore, the pick-and-place structure 15 set on the holding component 18 is in a line with the other pick-and-place structures 15.

The transmission structure 16 includes a first belt pulley 161, a second belt pulley 163, and a belt 165. The first belt pulley 161 is fixed in the driving device 11. In this embodiment, the driving device 11 is the motor, and therefore the first belt pulley 161 is fixed in a spindle of the motor. The second belt pulley 163 is fixed in the housing 10 and opposite to the first belt pulley 161, that the second belt pulley 163 is located at the side of the free end 143 of the lazy tongs 14. The belt 165 is connected with the first belt pulley 161 and the second belt pulley 163. The driving device 11 drives the first belt pulley 161 to roll, and the first belt pulley 161 drives the second belt pulley 163 to roll via the belt 165. Otherwise, the second belt pulley 163 is further set on a base 167. The base 167 can be fixed in the housing 10 according the one embodiment of the present invention.

In this embodiment, the operation method of the equidistance pick-and-place device 1, firstly, the driving device 11 drive the first belt pulley 161 of the transmission structure 16 to roll. The first belt pulley 161 forces the second belt pulley 163 to roll via the belt 165. The transmission component 135 is connected with the belt 165 and set on the moving component 131 fixed in the free end 143 of the lazy tongs 14. Therefore, when the belt 165 moves, the moving component 131 connected with the transmission component 135 is shifted, and the moving components 131 fixed in the shafts 145 of the lazy tongs 14 are forced to move. Thus, the pick-and-place structures 15 set on the moving components 131 are forced to move. The each of the moving components 131 and each of the pick-and-place structures 15 can move with equidistance for picking and placing the ICs because the equidistance pick-and-place device 1 utilizes the lazy tongs 14 to drive the moving components 131 and the pick-and-place structures 15.

Figure 3A:
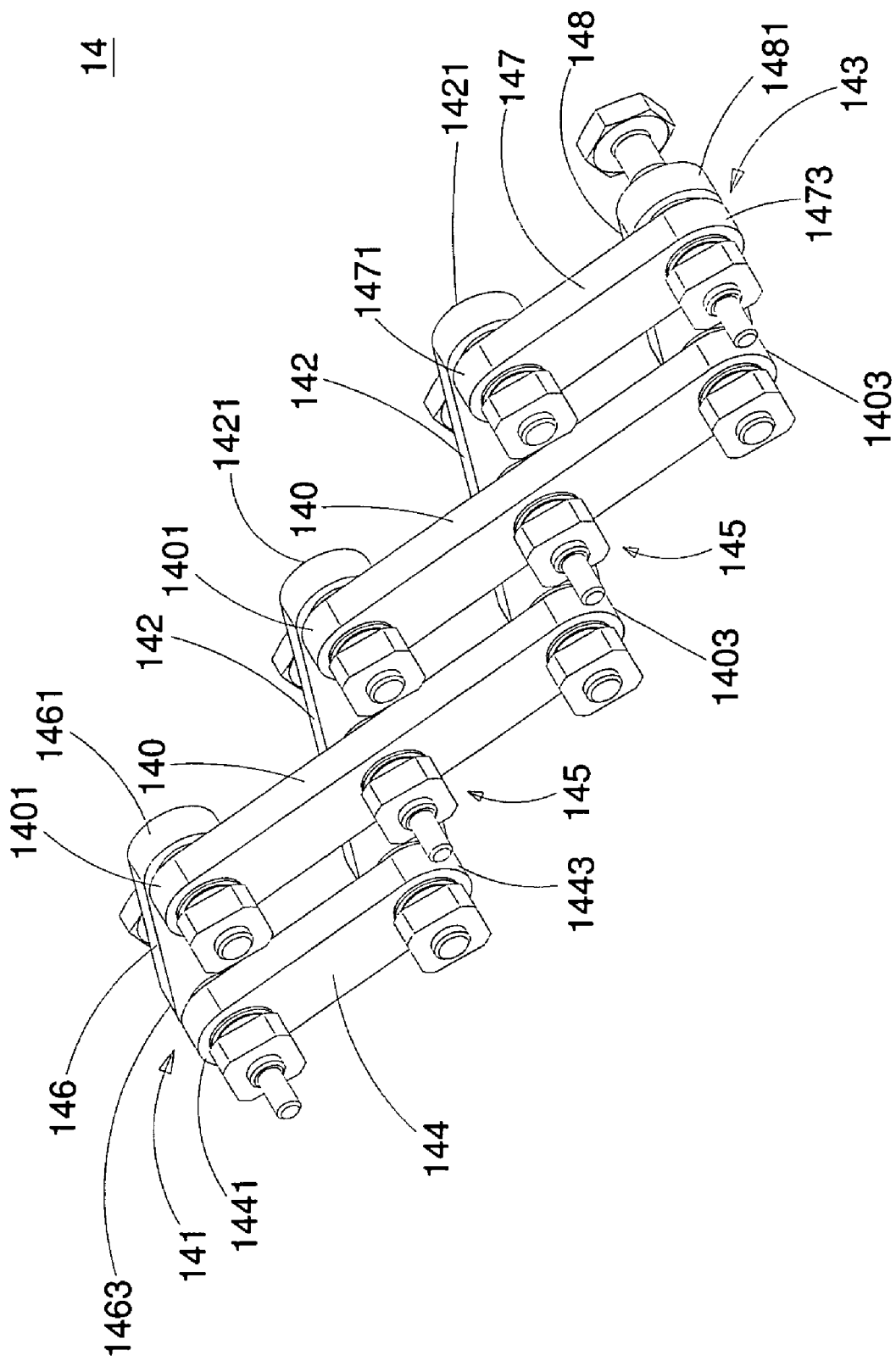
FIG. 3A shows a front view of the lazy tong according to one embodiment of the present invention.
Figure 3B:
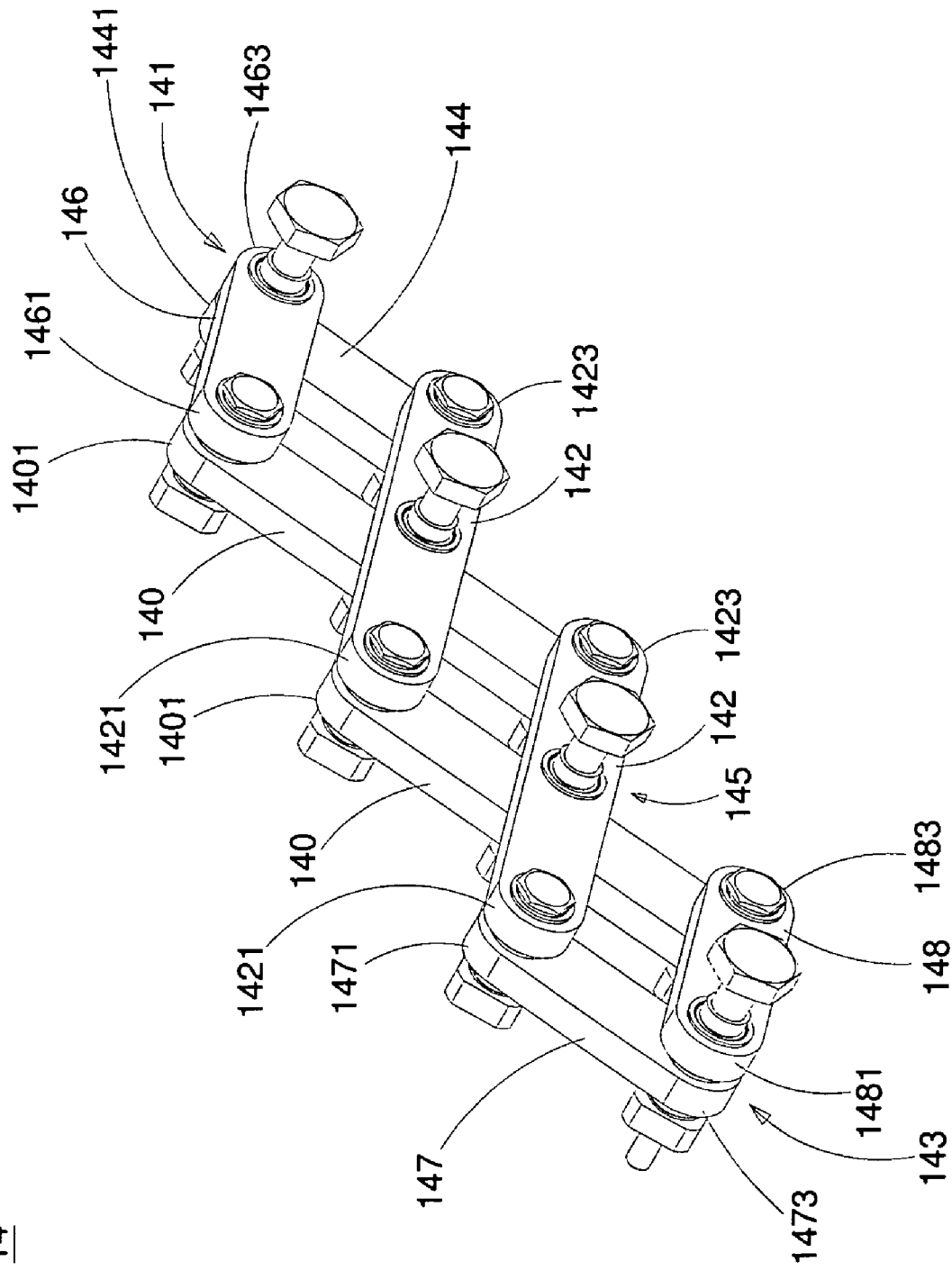
FIG. 3B shows a back view of the lazy tong according to one embodiment of the present invention.

Referring to FIG. 3A and FIG. 3B, a front view and a back view of the lazy tongs 14 of the present invention is illustrated respectively. The lazy tongs 14 includes a plurality of first links 140, a plurality of second links 142, a first fixed link 144, a second fixed link 146, a first free link 147, and a second free link 148. Each of the first links 140 includes a first end 1401 and a second end 1403 respectively. Each of the second links 142 includes a first end 1421 and a second end 1423 respectively. The second links 142 cross with the first links 140 respectively, wherein the crossing points of the first links 140 and second links 142 forms the shafts 145 of the lazy tongs 14. The first end 1401 of the first link 140 and the first end 1421 of the second link 142 are connected together, expect the first end 1401 of the first link 140 being adjacent to the driving device 11 (shown in FIG. 2) and the first end 1421 of the second link 142 being distant from the driving device 11. The second end 1423 of the second link 142 being adjacent to the driving device 11 and the second end 1403 of the first link 140 being distant from the driving device 11 are connected together.

The first fixed link 144 includes a first end 1441 and a second end 1443. The second end 1423 of the second link 142 being adjacent to the driving device 11 and the second end 1443 of the first fixed link 144 are connected together. The second fixed link 146 includes a first end 1461 and a second end 1463. The first end 1401 of the first link 140 being adjacent to the driving device 11 and the first end 1461 of the second fixed link 146 are connected together. The second end 1463 of the second fixed link 146 and the first end 1441 of the first fixed link 144 are connected together. The connecting point of the first end 1441 of the first fixed link 144 and the second end 1463 of the second fixed link 146 is the fixed end 141 of the lazy tongs 14.

The first free link 147 and the second free link 148 include first ends 1471, 1481 and second ends 1473, 1483 respectively. The first end 1421 of the second link 142 being distant from the driving device 11 and the first end 1471 of the first free link 147 are connected together. The second end 1403 of the first link 140 being distant from the driving device 11 and the second end 1483 of the second free link 148 are connected together. The first end 1481 of the second free link 148 and the second ends 1473 of the first free link 147 are connected together. The connecting point of the second end 1473 of the first free link 147 and the first end 1481 of the second free link 148 is the free end 143 of the lazy tongs 14

Accordingly, an equidistance pick-and-place device for ICs is provided. The lazy tongs is utilized to drive each of the pick-and-place structures moving with equidistance. The lazy tongs keeps the straight motion excellently for the straight motion of the pick-and-place structures. The pick-and-place structures can pick and place a plurality of ICs at a time for improving efficiency and reducing cost.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. An equidistance pick-and-place device for ICs, comprising:
    a housing supporting the equidistance pick and place device;
    a guideway structure set on the housing;
    a moving structure set on the guideway structure, and sliding on the guideway structure;
    a lazy tongs having a fixed end, a free end and a plurality of shafts, the free end and the shafts fixed in the moving structure, and the lazy tongs being parallel with the guideway structure, wherein the distance between the fixed end and the shaft being adjacent to the fixed end, the distances between the shafts, and the distance between the free end and the shaft being adjacent to the free end are equal when lazy tongs operates;
    a plurality of pick and place structures set on the moving structure for picking and placing the ICs with the equidistance;
    a driving device set on the housing; and
    a transmission structure connected with the driving device and the moving structure for driving the moving structure.

2. The equidistance pick-and-place device for ICs as claimed in claim 1, further comprising a pick and place structure set on the fixed end of the lazy tongs.

3. The equidistance pick-and-place device for ICs as claimed in claim 2, wherein the pick and place structure set on the fixed end of the lazy tongs comprises:
    an actuator set on the fixed end of the lazy tongs; and
    a nozzle connected to the actuator.

4. The equidistance pick-and-place device for ICs as claimed in claim 3, wherein the pick and place structure further comprises a carrier connected with the actuator for carrying the nozzle.

5. The equidistance pick-and-place device for ICs as claimed in claim 3, wherein the actuator is an air cylinder.

6. The equidistance pick-and-place device for ICs as claimed in claim 2, wherein the pick and place structure set on the fixed end is set on a holding component connected with the fixed end of the lazy tongs.

7. The equidistance pick-and-place device for ICs as claimed in claim 6, wherein the holding component is set on the housing.

8. The equidistance pick-and-place device for ICs as claimed in claim 1, wherein the fixed end of the lazy tongs is set on the housing.

9. The equidistance pick-and-place device for ICs as claimed in claim 1, wherein each of the pick and place structures set on the moving structure comprises:
    an actuator set on the moving structure; and
    a nozzle connected to the actuator.

10. The equidistance pick-and-place device for ICs as claimed in claim 9, wherein the pick and place structure further comprises a carrier connected with the actuator for carrying the nozzle.

11. The equidistance pick-and-place device for ICs as claimed in claim 9, wherein the actuator is an air cylinder.

12. The equidistance pick-and-place device for ICs as claimed in claim 1, wherein each of the pick and place structures set on the moving structure is set on a holding component, the holding component is set on the moving structure.

13. The equidistance pick-and-place device for ICs as claimed in claim 1, wherein the moving structure comprises a plurality of moving components fixed in the free end and the shafts of the lazy tongs respectively and sliding on the guideway structure, the pick and place structures are set on the moving components respectively.

14. The equidistance pick-and-place device for ICs as claimed in claim 13, wherein the moving structure further comprises a transmission component connected with the transmission structure, the transmission component is set on the moving component fixed in the free end of the lazy tongs.

15. The equidistance pick-and-place device for ICs as claimed in claim 13, wherein the moving structure further comprises a plurality of sliding components sliding on the guideway structure, the moving components are set on the sliding components respectively.

16. The equidistance pick-and-place device for ICs as claimed in claim 13, wherein the moving components slide on the guideway structure, the guideway structure comprises:
    a first guideway set on one side of the housing; and
    a second guideway set on another side of the housing, and the moving components sliding on the first guideway and the second guideway respectively.

17. The equidistance pick-and-place device for ICs as claimed in claim 16, wherein the first guideway and the second guideway are parallel with the shafts of the lazy tongs.

18. The equidistance pick-and-place device for ICs as claimed in claim 1, wherein the transmission structure comprises:
    a first belt pulley fixed in the driving device;
    a second belt pulley fixed in the housing and being opposite to the first belt pulley; and
    a belt connected with the first belt pulley and the second belt pulley.

19. The equidistance pick-and-place device for ICs as claimed in claim 1, wherein the lazy tongs is a parallel motion mechanism.

20. The equidistance pick-and-place device for ICs for IC as claimed in claim 19, wherein the lazy tongs comprises:
    a plurality of first links having a plurality of first ends and a plurality of second ends;

a plurality of second links having a plurality of first ends and a plurality of second ends, the first ends of the first link and the second link connected together, and the second ends of the first link and the second link connected together, wherein the second links cross with the first links respectively, and the crossing points of the first links and second links are the shafts of the lazy tongs;

a first fixed link having a first end and a second end, the second end of the second link being adjacent to the driving device and the second end of the first fixed link connected together;

a second fixed link having a first end and a second end, the first end of the first link being adjacent to the driving device and the first end of the second fixed link connected together, and the first end of the first fixed link and the second end of the second fixed link connected together, wherein a connecting point of the first end of the first fixed link and the second end of the second fixed link is the fixed end of the lazy tongs;

a first free link having a first end and a second end, the first end of the second link being distant from the driving device and the first end of the first free link connected together; and a second free link having a first end and a second end, the second end of the first link being distant from the driving device and the second end of the second free link connected together, and the second end of the first free link and the first end of the second free link connected together, wherein a connecting point of the second end of the first free link and the first end of the second free link is the free end of the lazy tongs.

* * * * *